United States Patent
Chu et al.

(10) Patent No.: US 6,519,151 B2
(45) Date of Patent: Feb. 11, 2003

(54) CONIC-SECTIONED PLATE AND JET NOZZLE ASSEMBLY FOR USE IN COOLING AN ELECTRONIC MODULE, AND METHODS OF FABRICATION THEREOF

(75) Inventors: Richard C. Chu, Poughkeepsie, NY (US); Michael J. Ellsworth, Jr., Lagrangeville, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/893,212

(22) Filed: Jun. 27, 2001

(65) Prior Publication Data

US 2003/0011987 A1 Jan. 16, 2003

(51) Int. Cl.⁷ ................................................ H05K 7/20
(52) U.S. Cl. ...................... 361/699; 165/80.4; 165/908; 361/702
(58) Field of Search ............... 165/80.4, 908; 174/15.1; 257/714; 361/689, 698–699, 702, 715

(56) References Cited

U.S. PATENT DOCUMENTS

| | | | | |
|---|---|---|---|---|
| 4,799,543 A | * | 1/1989 | Iversen et al. | 165/80.4 |
| 4,838,041 A | * | 6/1989 | Bellows et al. | 165/908 |
| 5,016,090 A | * | 5/1991 | Galyon et al. | 257/714 |
| 5,126,919 A | * | 6/1992 | Yamamoto et al. | 165/80.3 |
| 5,168,348 A | | 12/1992 | Chu et al. | 257/713 |
| 5,239,443 A | * | 8/1993 | Fahey et al. | 361/699 |
| 5,329,419 A | | 7/1994 | Umezawa | 361/699 |
| 5,353,865 A | * | 10/1994 | Adiutori et al. | 165/908 |
| 5,463,528 A | | 10/1995 | Umezawa | 361/699 |

FOREIGN PATENT DOCUMENTS

| | | |
|---|---|---|
| JP | 60160152 | 8/1985 |
| JP | 1251647 | 10/1989 |
| JP | 5109953 | 4/1993 |

\* cited by examiner

*Primary Examiner*—Gregory Thompson
(74) *Attorney, Agent, or Firm*—Andrew J. Wojnicki, Jr., Esq.; Kevin P. Radigan, Esq.; Heslin Rothenberg Farley & Mesiti P.C.

(57) ABSTRACT

Impingement plate and jet nozzle assemblies are presented for use in cooling an electronic module. The assemblies include a thermally conductive plate having a first main surface and a second main surface with a plurality of concave surface portions formed in the second main surface extending towards the first main surface. Each concave surface portion has a conic section profile. A plurality of jet nozzles are disposed above the thermally conductive plate with each jet nozzle being aligned over a respective concave surface portion, wherein fluid introduced into a concave surface portion through the respective jet it nozzle impinges upon a lower portion thereof and flows outward along the concave surface portion. Each conic section profile is one of an elliptical section, a circular section, or a parabolic section.

15 Claims, 8 Drawing Sheets

CONIC-SECTIONED PLATE AND JET NOZZLE ASSEMBLY FOR USE IN COOLING AN ELECTRONIC MODULE, AND METHODS OF FABRICATION THEREOF

CROSS-REFERENCE TO RELATED APPLICATION

This application contains subject matter which relates to the subject matter of the following commonly-owned application, which is hereby incorporated herein by reference in its entirety:

"Cavity Plate and Jet Nozzle Assemblies for Use In Cooling An Electronic Module, and Methods of Fabrication Thereof", Ser. No. 09/742,919, filed Dec. 21, 2000.

TECHNICAL FIELD

The present invention relates to heat transfer mechanisms, and more particularly, to heat transfer mechanisms and cooling assemblies for removing heat generated by an electronic circuit module.

BACKGROUND OF THE INVENTION

The efficient extraction of heat from electronic circuit modules for very large scale integrated circuit packages has presented a significant limitation on the design and use of such electronic modules. The power consumed in the integrated circuits generates heat which must in turn be removed from the package. Lacking an efficient heat transfer mechanism, the speed, reliability and power capabilities of the electronic circuit modules are limited. As the density of circuitry within very large scale integrated circuit chips has increased, the need for improved heat extraction has become even more acute since more densely packed chips tend to have a higher need for heat dissipation per unit area. It is also known that runaway thermal conditions and excessive heat generated by chips is a leading cause of failure of chip devices. Furthermore, it is anticipated that demand for heat removal from these devices will continue to increase indefinitely. Accordingly, it is seen that there is a significant need to continue to further improve upon cooling mechanisms for electronic devices.

SUMMARY OF THE INVENTION

Technology is fast approaching the limits of direct air cooling technologies (e.g., air cooled heat sinks), when applied to electronic modules such as large server processors. Liquid cooling technologies are believed to provide enhanced heat removal when air cooling technologies have reached their limits. Jet impingement of liquid coolant is one method of liquid cooling wherein a jet of coolant liquid impinges upon a flat surface. The advantage of jet impingement is that it is relatively simple to implement (i.e., low cost), and effective. Described herein is an enhanced jet impingement technique which extends the thermal performance of a jet impingement assembly by as much as forty percent or more. Specifically, the present invention proposes modifying the impingement surface to obtain both an improvement in the heat transfer characteristics of the cooling jet to impingement surface, and an increase in the surface area for heat transfer.

To briefly summarize, the present invention comprises in one aspect a cooling assembly for an electronic module. The cooling assembly includes a thermally conductive plate having a first main surface and a second main surface with at least one concave surface portion formed in the second main surface extending towards the first main surface. Each concave surface portion has a conic section profile. At least one jet nozzle is disposed above the at least one concave surface portion defined in the second main surface. Fluid introduced into each concave surface portion through a respective jet nozzle impinges upon a lower portion of the concave surface portion and flows outward along the concave surface portion. In practice, the conic section profile comprises one of an elliptical section, a circular section or a parabolic section.

In other aspects, the present invention comprises methods of fabricating a cooling assembly such as described above, as well as a cooling assembly and electronic module stack which employs a cooling assembly as summarized above.

To restate, various enhanced cooling assemblies with thermally conductive plates having concave surface portions with conic section profiles are presented herein. The conic-sectioned plate is disposed below multiple jet nozzles which impinge jets of fluid into the concave surface portions. The cooling assemblies presented herein facilitate the removal of heat from a structure, such as an electronic circuit module. These assemblies enhance the ability to remove a large amount of heat with a low temperature difference. Further, the assemblies presented are compact and modular in design.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Figure 1:
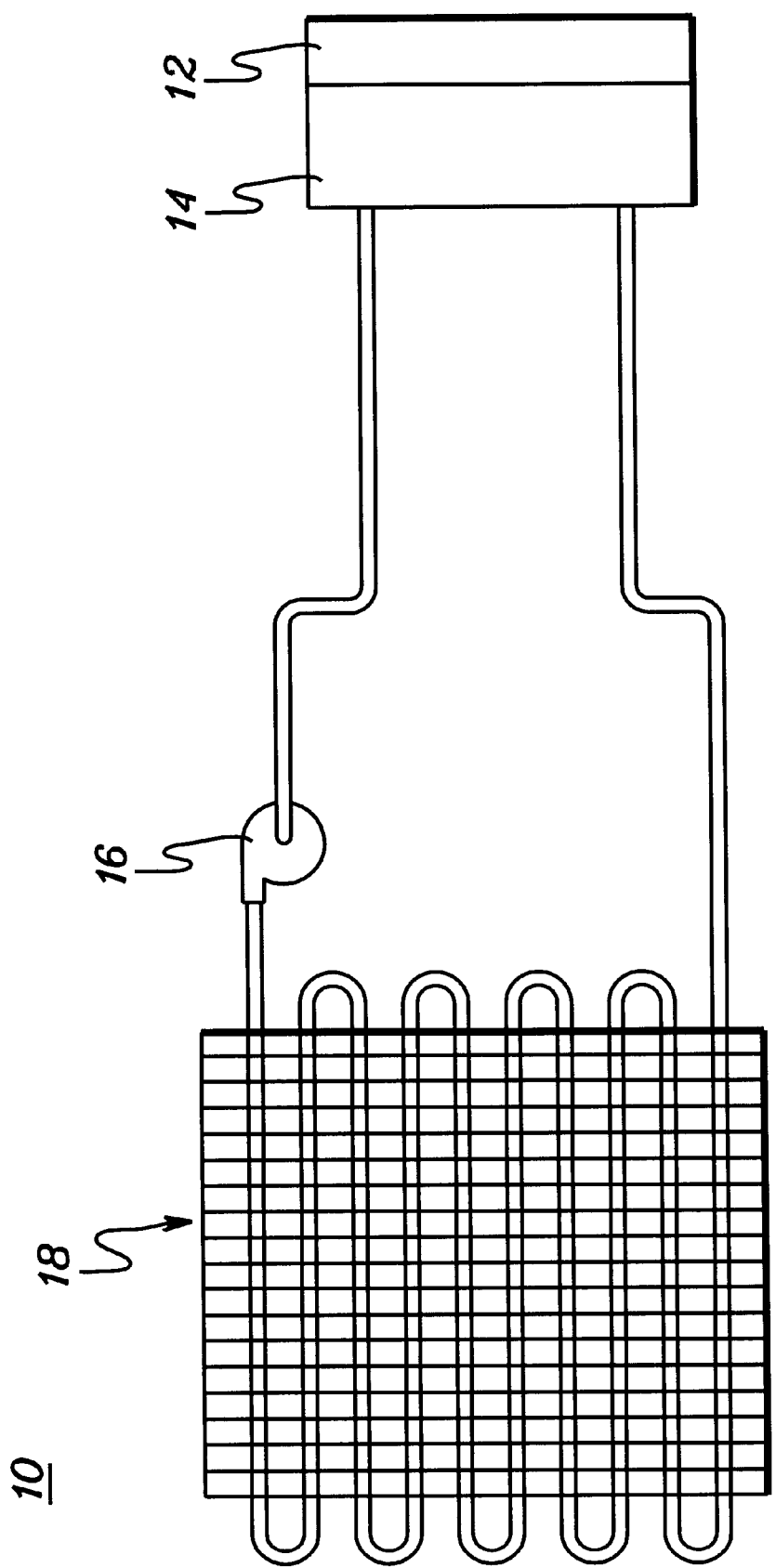
FIG. 1 illustrates a schematic of a hybrid air-closed loop coolant system to employ a cooling plate assembly in accordance with the principles of the present invention.

As noted briefly above, computers continue to increase both in speed and function. Dissipated heat increases accordingly, even for complementary metal oxide semiconductor (CMOS) circuitry that was once considered a low power technology. As heat dissipation rises, the limits of existing cooling medium for large server processors are quickly being approached using conventional direct air cooling technologies (e.g., air cooled heat sinks). One possible extension to direct air cooling is a hybrid/closed loop coolant system 10 such as depicted in FIG. 1. With this system, heat is transferred from an electronic module 12 to the coolant (for example, water) via a cold plate 14 which is thermally coupled to the module 12. Coolant is pumped 16 through an air/coolant heat exchanger 18 for dissipation of the heat to the surrounding environment. The present invention is directed in one aspect to an enhanced cold plate 14 for use within a cooling structure, such as depicted in FIG. 1. Those skilled in the art, however, will note that the present invention can be applied to other cooling applications, and work with a multitude of coolant fluids. Circulating water systems or the evaporator/cold head of a refrigeration system are examples.

Disclosed herein are novel cooling assemblies, and methods of manufacture thereof, for high thermal performance cold plates in which a fluid impinges upon lower surfaces of conic sections defined within an impingement plate in thermal contact with an electronics module. As used herein, a conic area or conic section profile comprises one of an elliptical section, circular (or spherical) section or parabolic section defining a concave surface portion formed in a main surface of a thermally conductive plate.

Figure 2:
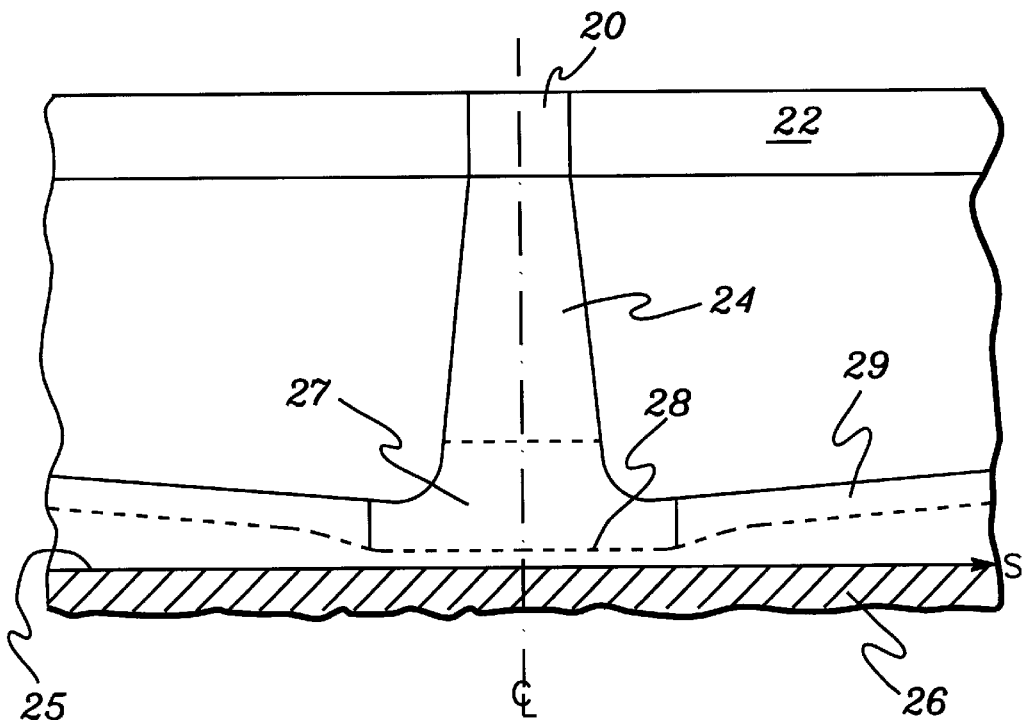
FIG. 2 illustrates a conventional jet impingement assembly wherein liquid impinges upon a flat surface of a thermally conductive plate.

FIG. 2 depicts a cross-section of a conventional jet impingement assembly wherein a jet orifice 20 in a jet nozzle plate 22 directs fluid 24 onto a flat surface 25 of an impingement plate 26. As shown, an impingement or stagnation region 27 is set up about a center line of the impinging fluid with respect to jet orifice 20. Within this region 27 a boundary layer 28 comprises a relatively thin layer atop impingement surface 25, meaning that greater heat transfer occurs in this region. However, as the direction of momentum of the fluid changes to passing along the flat impingement surface 25, the thickness of the boundary layer increases in the wall jet region 29, thereby reducing the thermal transfer coefficient between the fluid and the impingement surface.

Before describing embodiments of an enhanced cooling assembly in accordance with the principles of the present invention, boundary layer development is briefly discussed.

As fluid flows over a surface or through a passage comprised of bounding surfaces, some of the fluid particles make contact with the surface and will assume zero velocity. These particles then act to retard the motion of particles in the adjoining fluid layer, which act to retard the motion of particles in the next adjoining fluid layer. At some distance from the surface this viscous effect becomes negligible, and the velocity of fluid particles further away from the wall(s) is unaffected by the presence of the wall. The region of flow which develops from the leading edge of the surface(s) and in which the effects of viscosity are felt, is called the boundary layer. An arbitrary point is used to designate the thickness of the boundary layer from that surface, and is usually chosen as the Y coordinate at which the fluid velocity is 99% of the free-stream value.

As flow moves along a surface or passage, the boundary layer continues to grow in thickness. This concept is shown in the wall jet region 29 of the fluid profile of FIG. 2. Although discussing here the formation of a fluid or hydrodynamic boundary layer, if the impingement surface is hotter than the fluid, a thermal boundary layer will form in an analogous manner. In this instance, the temperature of the fluid at the wall will be equal to the temperature at the surface and will decay in magnitude further away from the impingement surface.

The heat transfer coefficient or rate at which heat is transferred from the surface to the fluid per unit temperature difference is ultimately associated with the development of the hydrodynamic and thermal boundary layers in convective processes. In general, as a boundary layer gets thicker, the heat transfer coefficient decreases in magnitude. Therefore, with reference to FIG. 2, the heat transfer coefficient will be highest in the impingement region 27 and degrade as flow moves outward and the boundary layer thickens.

Figure 3:
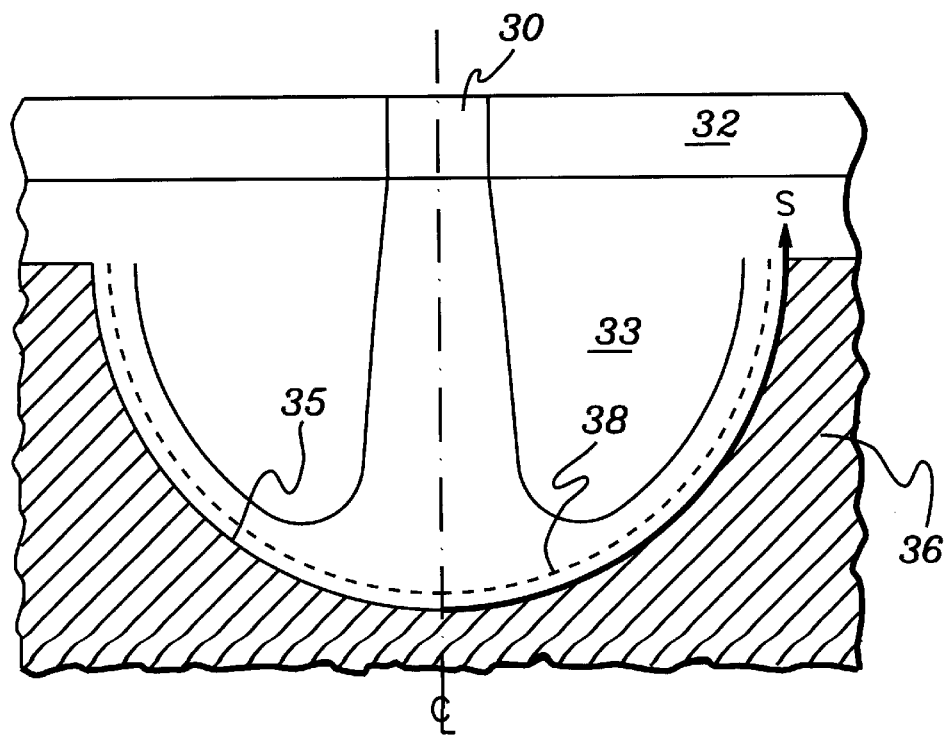
FIG. 3 is a cross-sectional elevational view of one embodiment of a cooling assembly having a conic-sectioned plate with a jet nozzle disposed thereabove, and depicting basic fluid flow concepts in accordance with the principles of the present invention.

One objective of the present invention is to reduce the boundary layer thickness a further distance out from the impingement region, and thereby enhance the heat transfer coefficient of the fluid. One embodiment of an impingement surface which accomplishes this objective is depicted in FIG. 3.

As shown, fluid is introduced through a jet orifice 30 in a jet nozzle plate 32 to impinge upon a lower portion of a concave surface portion 33 formed in the upper surface of an impingement plate 36. In this example, the concave surface portion has a circular (or semi-circular) cross-section with the impingement surface 35 of plate 36 comprising a continuously curving surface portion formed in the main impingement surface of plate 36. As shown, the boundary layer 38 that sets up within concave surface portion 33 remains thin as fluid moves radially outward from an origin, or center line, of the fluid impact point on the lower portion of the concave surface portion. This is because the concave surface portion imparts centrifugal forces onto the fluid creating an artificial G field that causes the boundary layer to remain thin. That is, the momentum of the fluid continues to change within the conic area profile because of the concave surface portion, and thus, the fluid continues to accelerate outward for what amounts to be a larger surface area, i.e., a further distance S from the center line than in the case of a flat surface impingement.

Figure 4:
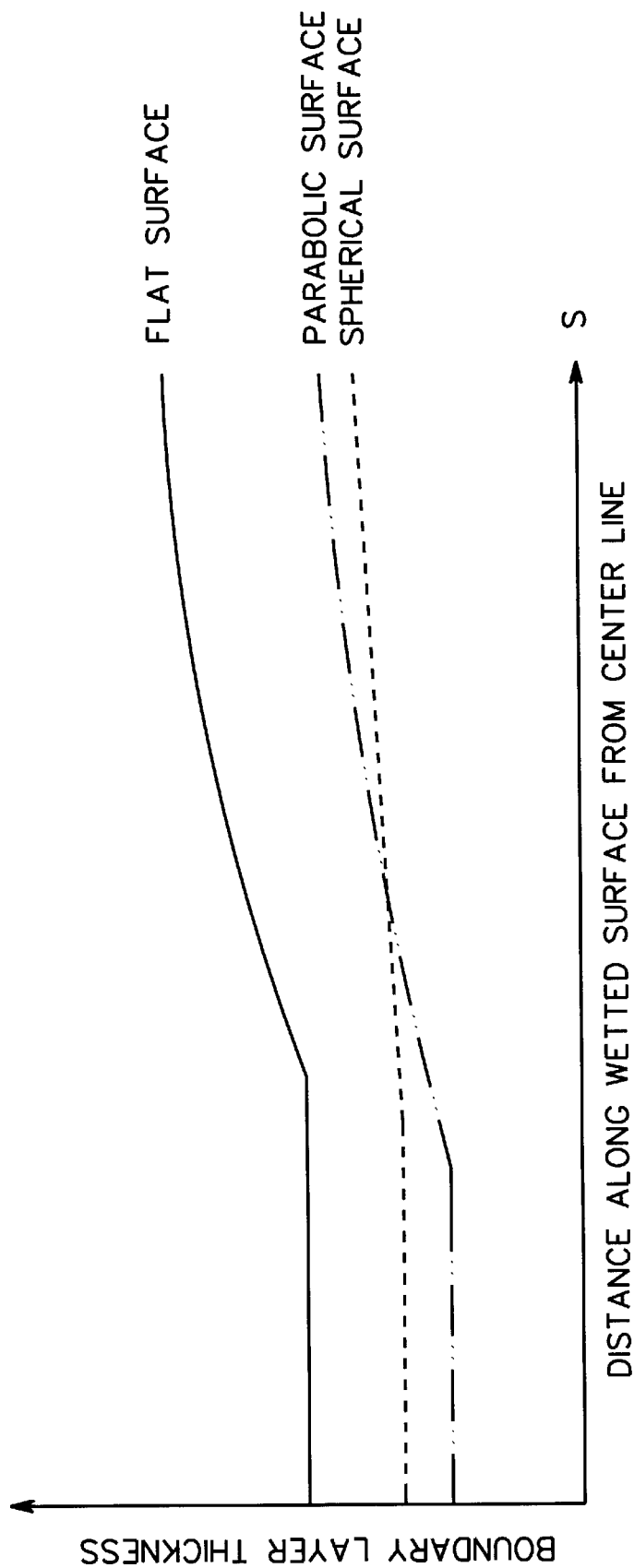
FIG. 4 is a graph of boundary layer thickness versus wetted surface length (S) from a center line for various types of impingement surfaces comparing various conic-sectioned surfaces in accordance with the present invention with a conventional flat impingement surface.

FIG. 4 graphically represents boundary layer thickness of an impinging fluid on various surfaces. A comparison is shown for boundary layer thickness versus distance along wetted surface from center line of fluid impinging upon a flat surface, a parabolic surface and a spherical (i.e., circular) surface. As shown, the boundary layer thickness is substantially smaller for the parabolic surface and spherical surface than for the conventional flat surface. In the case of impingement on a flat surface, the boundary layer thickness increases because there is no additional acceleration of the fluid after leaving the impingement or stagnation region, which is contrasted with the case of a spherical or parabolic surface.

In accordance with the present invention, heat transfer enhancement is realized in two ways. First, an increase in the average heat transfer coefficient is obtained. This is because the local heat transfer coefficient is inversely proportional to the boundary layer thickness at a given location. Also, as noted above, impinging a jet on a flat surface produces a boundary layer that has a minimum thickness at the stagnation point and a thickness which increases as liquid moves radially outward from that point. The change in the fluid's momentum (acceleration) at the stagnation point is the reason for the minimum boundary layer thickness; i.e., the acceleration tends to compress the boundary layer. Once the fluid completes its turn and flows parallel to the flat surface, there is no longer a change in momentum tending to compress the boundary layer. The result is a high heat transfer coefficient over a relatively small area (i.e., the stagnation point) and a decreasing heat transfer coefficient as the fluid moves radially outward from the stagnation point.

As noted above, fluid and thermal dynamics of fluid impingement on a flat surface are to be contrasted with fluid impingement on a concave surface portion having a conic surface profile in accordance with the present invention. For example, in the case of a circular cavity, fluid continues to accelerate as it flows along the concave surface wall. This acceleration tends to compress the boundary layer along the surface resulting in an increased local heat transfer and an increase to the overall average heat coefficient.

Figure 5:
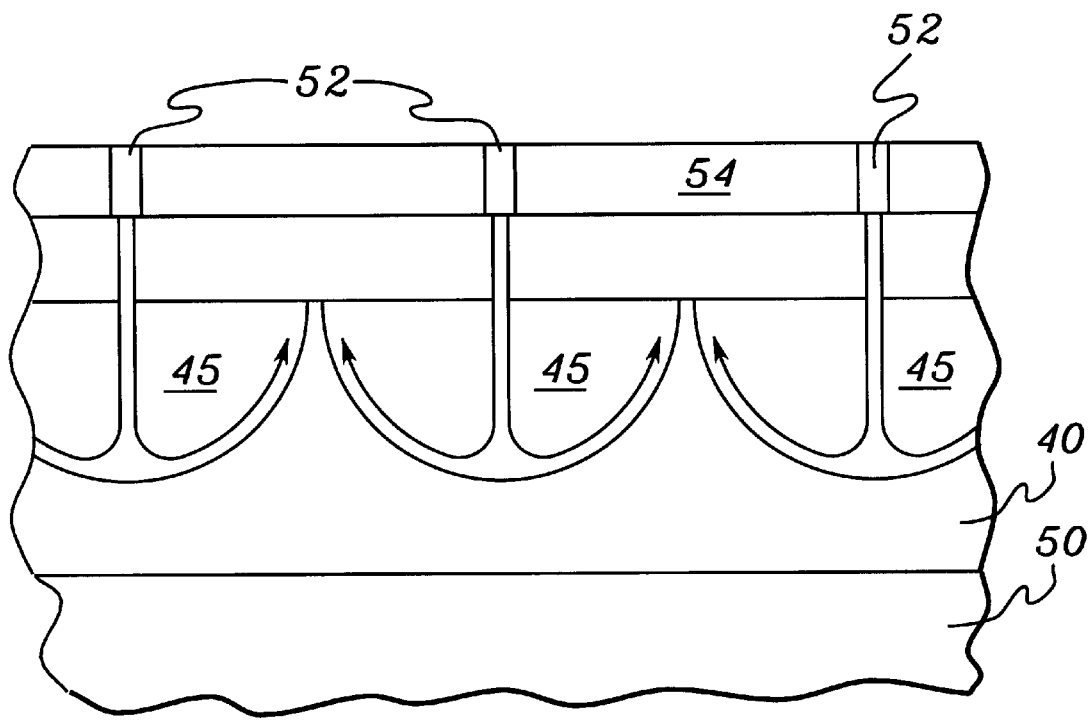
FIG. 5 is a partial cross-sectional elevational view of one embodiment of a cooling assembly disposed above an electronic module in accordance with the principles of the present invention, wherein multiple concave surface portions are shown formed in the impingement plate of the cooling assembly.
Figure 6:
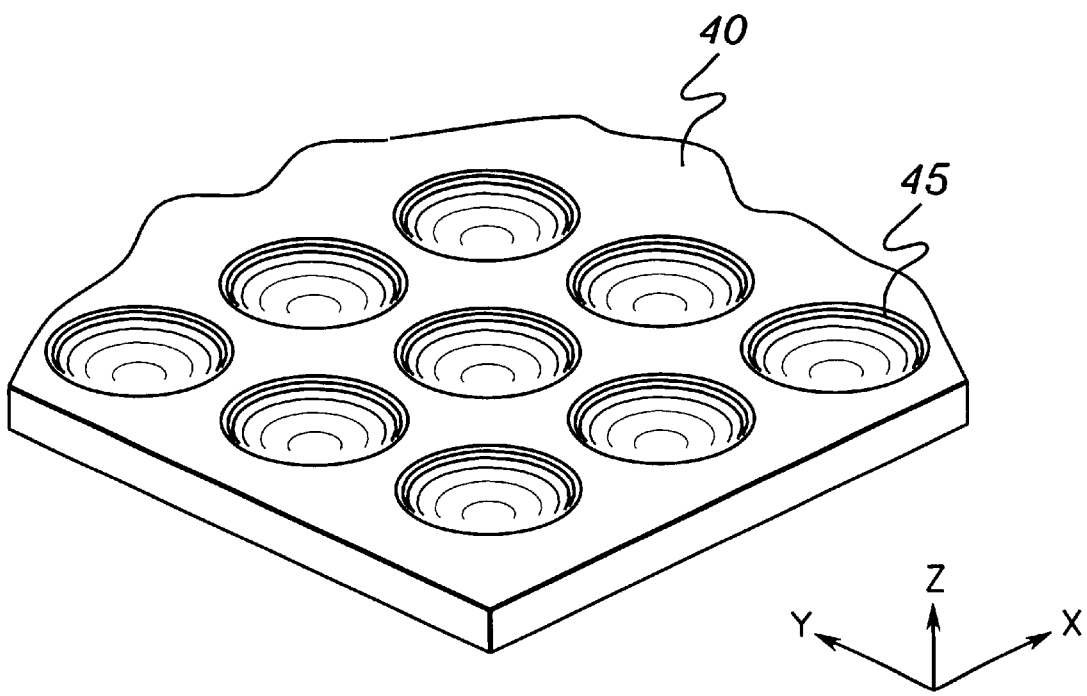
FIG. 6 is a partial isometric view of an impingement surface having multiple concave surface portions formed therein in accordance with the present invention.

Referring to FIGS. 5 & 6, one embodiment of an impingement plate 40 having concave surface portions 45 disposed in an upper impingement surface thereof is shown. Impingement plate 40 comprises a thermally conductive plate which in the embodiment of FIG. 5 is thermally coupled to an electronic module 50. A cooling jet is directed at the impingement surface of plate 40 through jet orifices 52 formed in jet plate 54. Again, the jet orifices are individually aligned over a lower portion of a respective concave surface portion 45 formed in the impingement surface of plate 40. After leaving the impingement region in the lower portion of the concave surface portion, the fluid continues to accelerate up the concave side walls of the section thereby retaining a thin boundary layer a greater distance from the impingement point. As shown in FIG. 6, a plurality of concave surface portions may be formed within the impingement surface of plate 40. Additionally, each concave surface portion can have any one of an elliptic cross-section, circular cross-section or parabolic cross-section. The circular cross-sections are depicted in FIGS. 5 & 6 for purposes of discussion only. In addition, various shaped concave surface portions can be intermixed within an impingement plate.

The second way heat transfer is enhanced is by increasing the surface area for heat transfer as described further below in connection with FIGS. 7A - 7C.

Figure 7A:
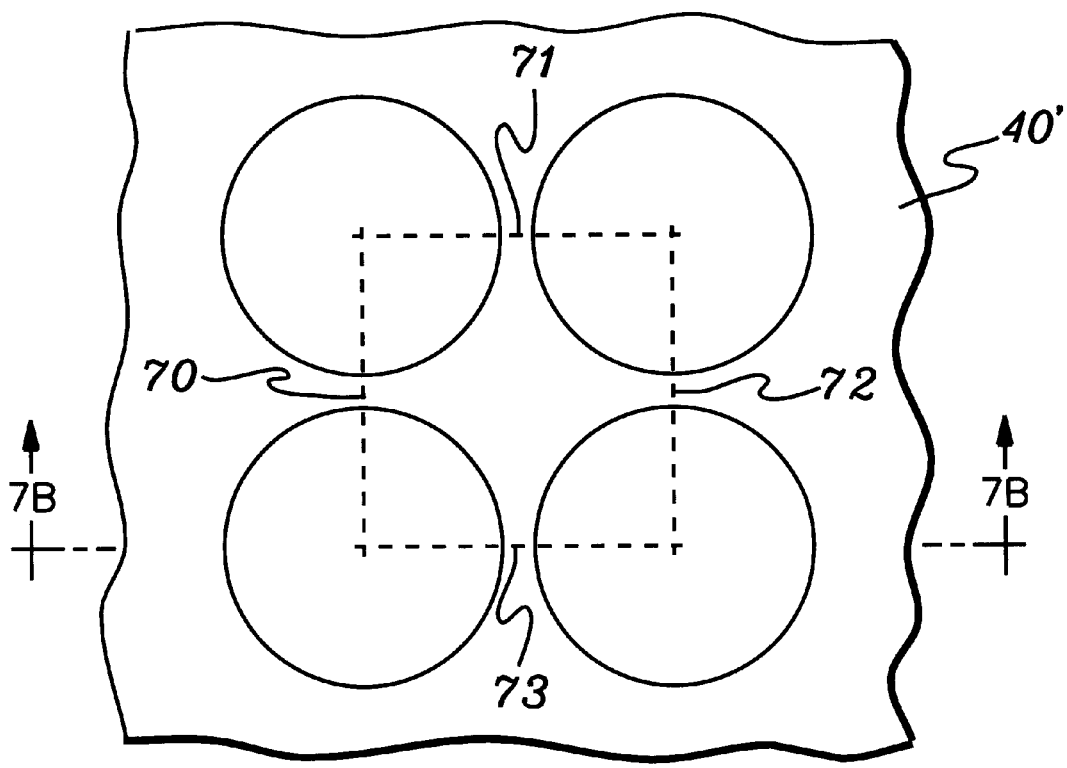
FIG. 7A is a top plan view showing an array of concave surface portions within an impingement plate in accordance with one embodiment of the present invention.
Figure 7B:
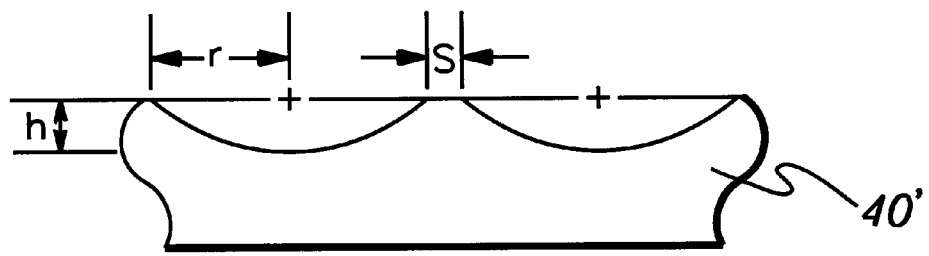
FIG. 7B is a cross-sectional elevational view of the impingement plate of FIG. 7A.
Figure 7C:
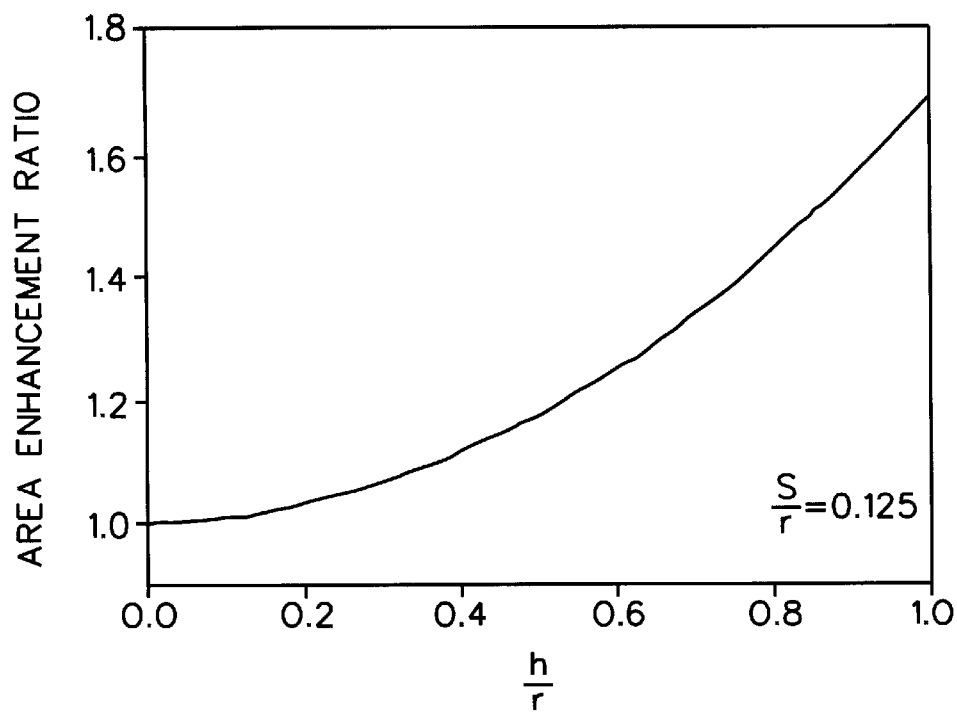
FIG. 7C is a graph illustrating the increased surface area provided by an impingement plate having concave surface portions in accordance with the present invention, wherein a maximum enhanced surface area is shown to comprise a circular configuration with the height or depth of the conic section profile equal to the radius from a center line to an edge thereof.
Figure 8:
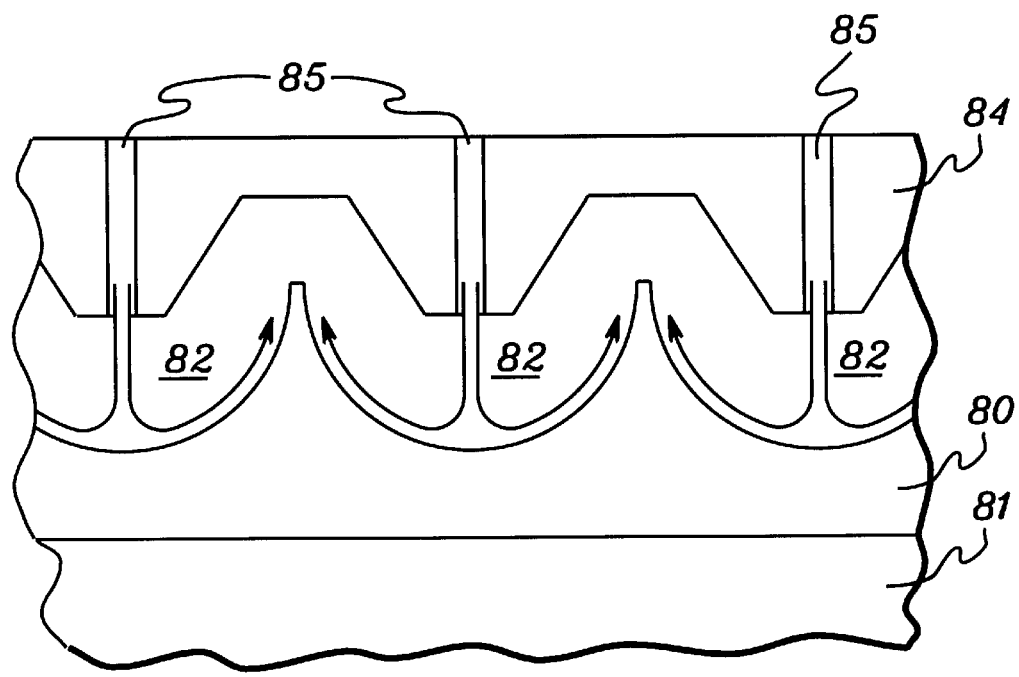
FIG. 8 is a partial cross-sectional view of an alternate embodiment of a cooling assembly in accordance with the present invention disposed above an electronic module for removing heat therefrom, wherein the cooling assembly comprises modified jet nozzles which are at least partially disposed within the respective concave surface portions of the impingement plate.

FIGS. 7A–7C depict area enhancement for an array of spherical cavities. These spherical cavities reside in the surface of impingement plate 40' shown in FIGS. 7A and 7B. Surface area can be increased by upwards of 70% when the cavity has a circular profile (i.e., S/r=1), wherein S is the space between concave surface portions and r is the radius of the conic section at the point of intersection of the upper, main surface of the impingement plate 40' (i.e., radius r lies along the plane designated by sectional lines 70–73 shown in FIG. 7A). The variable h comprises the depth of the concave surface portion. As can be seen from FIG. 7C, as the depth h approaches the radius r the greatest surface area enhancement is attained.

A finite element analysis has been performed to predict the overall thermal performance of an array of cooling jets aimed at concave surface portions (having conic section profiles) formed within an impingement plate. The results were compared to that of an array of jets on a flat surface. The geometry of the conic section was modeled with a heat transfer coefficient equal to that obtained for the jets on the flat surface (i.e., conservative estimate). The analysis suggested a concave surface portion with a circular profile yields a thermal resistance at least 40% lower than that for a flat surface.

Figure 9A:
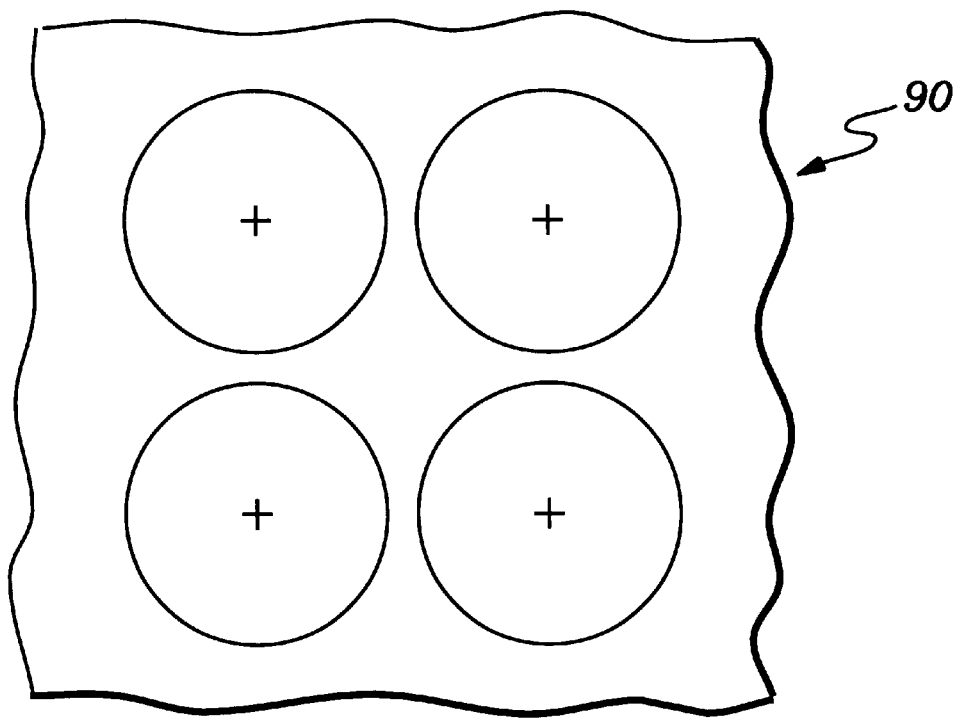
FIG. 9A is a top plan view showing an array of parabolic concave surface portions within an impingement plate in accordance with an aspect of the present invention.
Figure 9B:
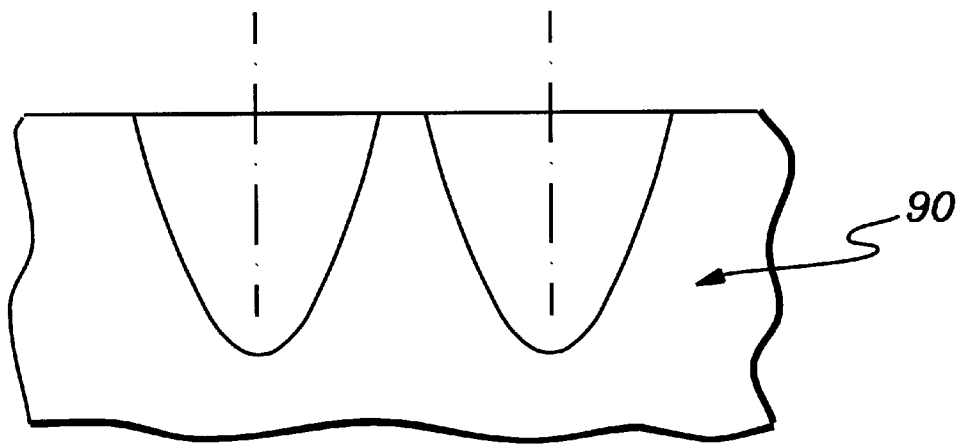
FIG. 9B is a cross-sectional elevational view of the impingement plate of FIG. 9A.
Figure 10A:
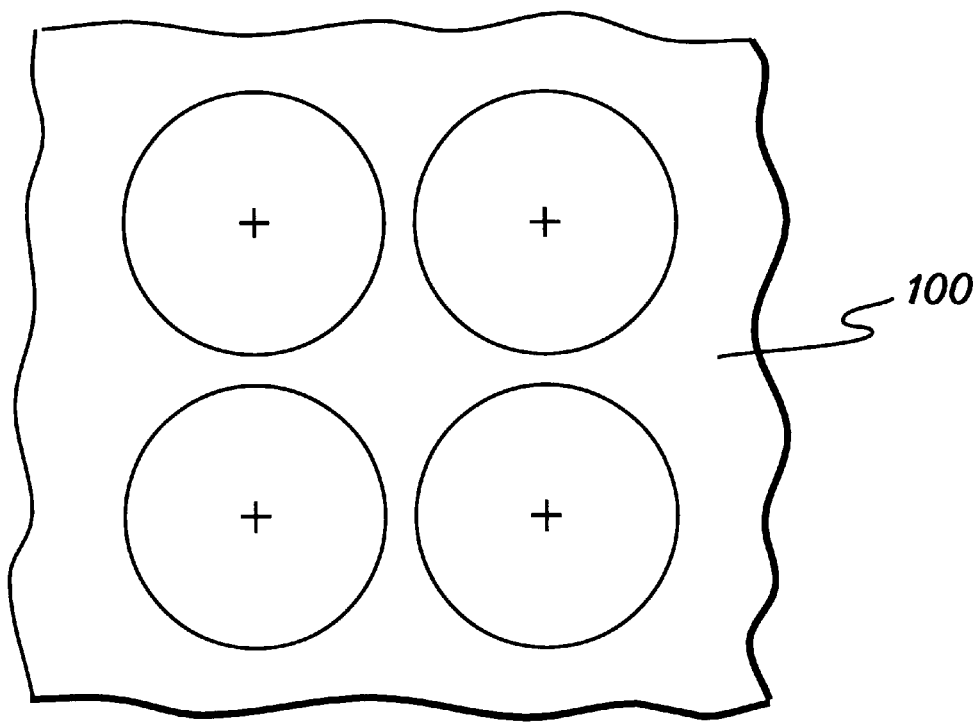
FIG. 10A is a top plan view showing an array of elliptical concave surface portions within an impingement plate, in accordance with another aspect of the present invention.
Figure 10B:
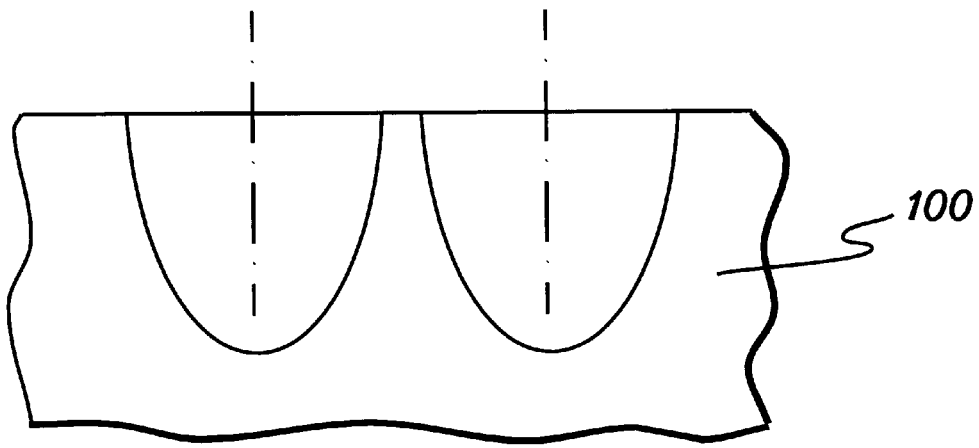
FIG. 10B is a cross-sectional elevational view of the impingement plate of FIG. 10A.

FIGS. 9A and 9B depict an alternate embodiment of an impingement plate 90 in accordance with an aspect of the present invention. Impingement plate 90 is shown to include multiple parabolic concave surface portions formed within the impingement surface of the plate. FIGS. 10A and 10B depict still another embodiment of an impingement plate 100 in accordance with an aspect of the present invention. Impingement plate 100 includes multiple elliptical concave surface portions formed within the impingement surface of the plate as shown.

Although preferred embodiments have been depicted and described in detail herein, it will be apparent to those skilled in the relevant art that various modifications, additiuons, substitutions and the like can be made without departing from the spirit of the invention and these are therefore considered to be within the scope of the invention as defined in the following claims.

What is claimed is:

1. A cooling assembly for an electronic module, said cooling assembly comprising:

a thermally conductive plate having a first main surface and a second main surface with at least one concave surface portion formed in said second main surface extending towards said first main surface, said at least one concave surface portion individually having a conic section profile; and at least one jet nozzle disposed above the at least one concave surface portion, wherein fluid introduced into said at least one concave surface portion through said at least one jet nozzle impinges upon a lower portion thereof and flows outward along the concave surface portion of said second main surface, wherein said at least one conic section profile comprises one of an elliptical section or a parabolic section.

2. The cooling assembly of claim 1, wherein once introduced, fluid within said at least one concave surface portion establishes a minimum boundary layer over a greater surface area compared with a minimum boundary layer established by fluid impinging upon a flat surface from said at least one jet nozzle.

3. The cooling assembly of claim 1, wherein fluid introduced into said concave surface portion accelerates outside of an impingement region, said impingement region residing about a center line of fluid impinging upon said lower portion from said at least one jet nozzle.

4. The cooling assembly of claim 1, wherein said at least one concave surface portion individually defining a respective conic section comprises a continuously curving surface portion of said second main surface.

5. The cooling assembly of claim 4, wherein said at least one concave surface portion comprises a plurality of concave surface portions formed in said second main surface of said thermally conductive plate, and wherein said at least one concave surface portion individually comprises a circular section, and said plurality of concave surface portions are disposed in an array across said second main surface of said thermally conductive plate.

6. The cooling assembly of claim 1, wherein said at least one concave surface portion comprises a plurality of concave surface portions formed in said second main surface of said thermally conductive plate, and wherein said at least one jet nozzle comprises a plurality of jet nozzles, each jet nozzle of said plurality of jet nozzles being disposed above a respective concave surface portion of said plurality of concave surface portions in said thermally conductive plate.

7. The cooling assembly of claim 6, wherein said plurality of jet nozzles are formed in a jet nozzle plate and are each sized to extend into a respective concave surface portion of said plurality of concave surface portions in said thermally conductive plate.

8. A cooling assembly and electronic module stack comprising:
   an electronic module having an upper surface;
   a cooling assembly thermally coupled to the upper surface of said electronic module, said cooling assembly comprising:
      a thermally conductive plate having a first main surface and a second main surface with at least one concave surface portion formed in said second main surface extending towards said first main surface, said at least one concave surface portion individually having a conic section profile; and
      at least one jet nozzle disposed above the at least one concave surface portion, wherein fluid introduced into said at least one concave surface portion through said at least one jet nozzle impinges upon a lower portion thereof and flows outward along the concave surface portion, wherein
         said at least one conic section profile comprises one of an elliptical section or a parabolic section.

9. The cooling assembly and electronic module stack of claim 8, wherein said at least one concave surface portion individually comprises a continuously curving surface portion of said second main surface.

10. The cooling assembly and electronic module stack of claim 8, wherein said at least one concave surface portion comprises a plurality of concave surface portions formed in said second main surface of said thermally conductive plate, and wherein said at least one jet nozzle comprises a plurality of jet nozzles, each jet nozzle of said plurality of jet nozzles being disposed above a respective concave surface portion of said plurality of concave surface portions in said thermally conductive plate.

11. The cooling assembly and electronic module stack of claim 10, wherein said plurality of jet nozzles are formed in a jet nozzle plate and are each sized to extend into a respective concave surface portion of said plurality of concave surface portions in said thermally conductive plate.

12. A method of fabricating a cooling assembly for an electronic module, said method comprising:
   providing a thermally conductive impingement plate having a first main surface and a second main surface, wherein said thermally conductive impingement plate includes a plurality of concave surface portions in said second main surface extending towards said first main surface, each concave surface portion having a conic section profile; and
   providing a plurality of jet nozzles disposed above the thermally conductive impingement plate, with each jet nozzle being aligned over a respective concave surface portion of said plurality of concave surface portions, wherein fluid introduced into each concave surface portion through a respective jet nozzle impinges upon a lower portion thereof and flows outward along each concave surface portion of said second main surface, wherein each conic section profile comprises one of an elliptical section or a parabolic section.

13. The method of claim 12, wherein said providing the thermally conductive impingement plate comprises forming each concave surface portion as a continuously curving surface portion of said second main surface.

14. The method of claim 13, wherein said plurality of concave surface portions comprise a plurality of circular sections arrayed across said second main surface of said thermally conductive impingement plate.

15. The method of claim 12, wherein the said providing a plurality of jet nozzles comprises providing a jet nozzle plate having said plurality of jet nozzles formed therein, wherein said plurality of jet nozzles formed in said jet nozzle plate are each sized to extend into a respective concave surface portion of said plurality of concave surface portions in said thermally conductive impingement plate.

* * * * *